(12) United States Patent
Spinner, III et al.

(10) Patent No.: US 7,534,719 B2
(45) Date of Patent: May 19, 2009

(54) METHOD FOR REDUCTION IN METAL DISHING AFTER CMP

(75) Inventors: Charles R. Spinner, III, Phoenix, AZ (US); Rebecca A. Nickell, Phoenix, AZ (US); Todd H. Gandy, Phoenix, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 12/082,188

(22) Filed: Apr. 9, 2008

(65) Prior Publication Data
US 2008/0188077 A1    Aug. 7, 2008

Related U.S. Application Data

(62) Division of application No. 09/871,463, filed on May 31, 2001, now Pat. No. 7,372,160.

(51) Int. Cl.
*H01L 21/4763* (2006.01)
(52) U.S. Cl. .................. 438/631; 438/633; 438/645; 438/691
(58) Field of Classification Search .......... 438/622, 438/626, 631, 633, 645, 690–693
See application file for complete search history.

(56) References Cited

U.S. PATENT DOCUMENTS

| | | | |
|---|---|---|---|
| 5,614,437 A | 3/1997 | Choudhury | |
| 5,618,381 A | 4/1997 | Doan et al. | |
| 5,889,328 A | 3/1999 | Joshi et al. | |
| 6,054,383 A | 4/2000 | Suzuki et al. | |
| 6,060,787 A | 5/2000 | Zhao et al. | |
| 6,096,632 A | 8/2000 | Drynan | |
| 6,103,625 A | 8/2000 | Marcyk et al. | |
| 6,169,028 B1 | 1/2001 | Wang et al. | |
| 6,175,154 B1 | 1/2001 | Gillespie | |
| 6,344,408 B1 * | 2/2002 | Chen et al. | 438/633 |
| 6,346,741 B1 | 2/2002 | Van Buskirk et al. | |
| 6,417,093 B1 * | 7/2002 | Xie et al. | 438/626 |
| 6,436,814 B1 | 8/2002 | Horak et al. | |
| 6,492,260 B1 | 12/2002 | Kim et al. | |
| 6,828,227 B2 * | 12/2004 | Blalock et al. | 438/626 |
| 7,307,021 B1 * | 12/2007 | Carlson | 438/691 |

OTHER PUBLICATIONS

Data base WPI, Section Ch. Week 200116, Derwent Publications Ltd., London, GB; An 2001-156149, XP 002260086 & KR 2000 037 768 A (Samsung Electronics Co., Ltd.), Jul. 5, 2000, abstract.

* cited by examiner

*Primary Examiner*—Kevin M Picardat
(74) *Attorney, Agent, or Firm*—Lisa K. Jorgenson; William A. Munck

(57) ABSTRACT

A protective barrier layer, formed of a material such as titanium or titanium nitride for which removal by chemical mechanical polishing (CMP) is primarily mechanical rather than primarily chemical, formed on a conformal tungsten layer. During subsequent CMP to pattern the tungsten layer, upper topological regions of the protective barrier layer (such as those overlying interlevel dielectric regions) are removed first, exposing the tungsten under those regions to removal, while protective barrier layer regions over lower topological regions (such as openings within the interlevel dielectric) remain to prevent chemical attack of underlying tungsten. CMP patterned tungsten is thus substantially planar with the interlevel dielectric without dishing, even in large area tungsten structures such as MOS capacitor structures.

20 Claims, 3 Drawing Sheets

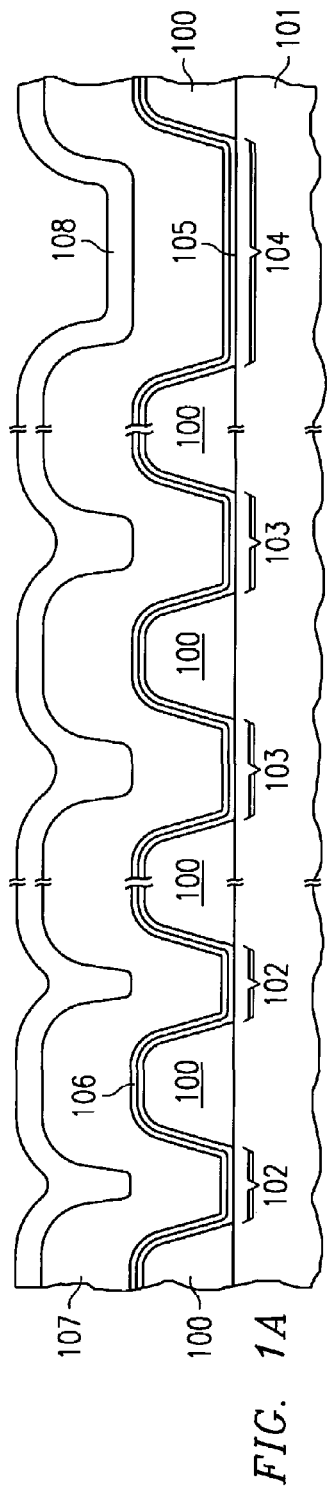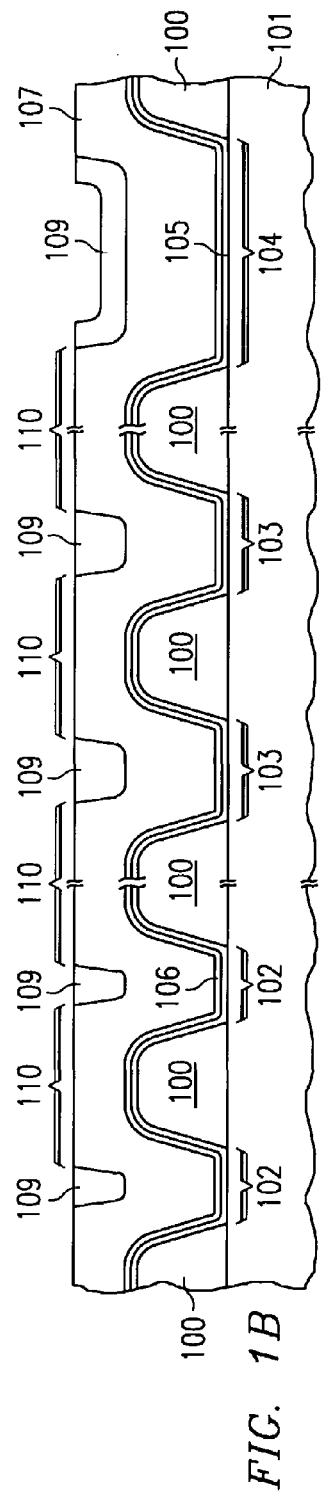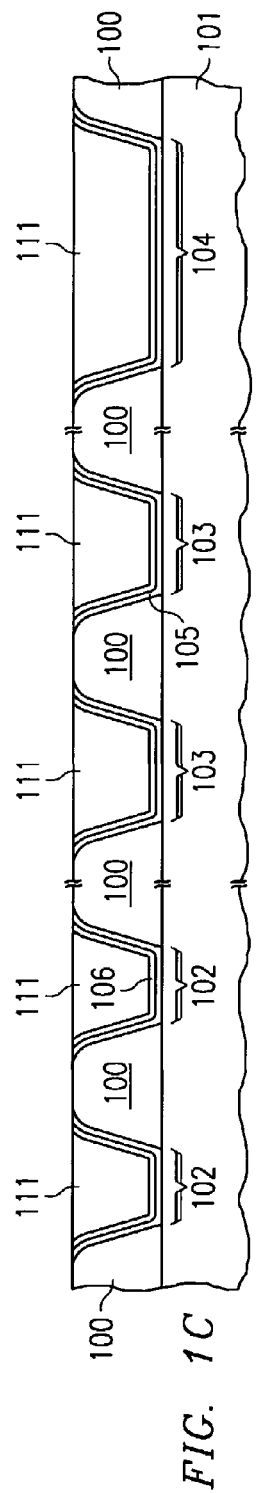

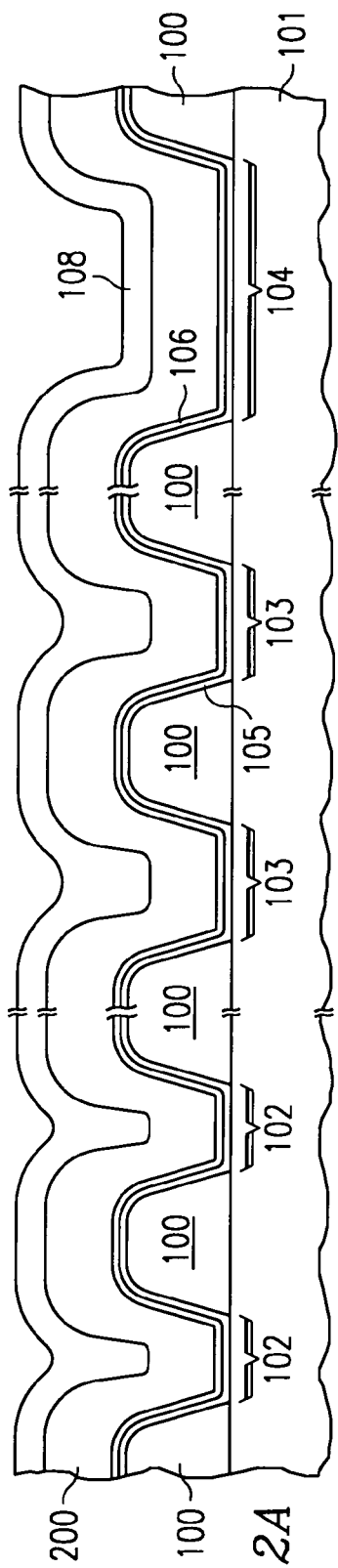
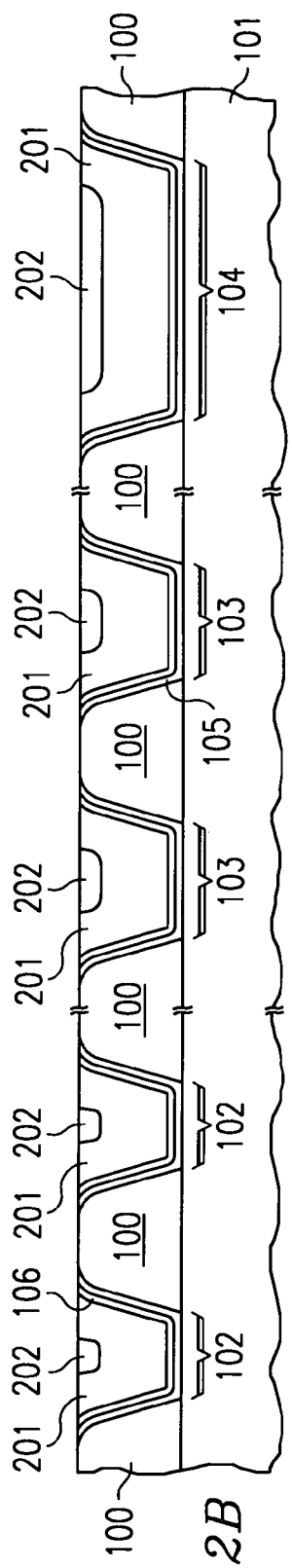
FIG. 2A
FIG. 2B

METHOD FOR REDUCTION IN METAL DISHING AFTER CMP

This application is a divisional of prior U.S. patent application Ser. No. 09/871,463 filed on May 31, 2001 now U.S. Pat. No. 7,372,160.

TECHNICAL FIELD OF THE INVENTION

The present invention is directed, in general, to chemical mechanical polishing during formation of integrated circuits and, more specifically, to chemical mechanical polishing of a primarily chemical nature of conformal layers within integrated circuits.

BACKGROUND OF THE INVENTION

A key process for forming metal regions within integrated circuits is chemical mechanical polishing (CMP), which involves mechanical polishing of a substrate's active layer surface utilizing an abrasive slurry containing chemicals which react with—and aid in the removal of—the target material on the substrate surface. For tungsten (W) metal layers, for instance, the abrasive slurry employed in chemical mechanical polishing will typically include one or more chemical substances which oxidize the tungsten metal and remove the oxidized tungsten.

A primary benefit of chemical mechanical polishing, in general, is planarization of the upper surface of the integrated circuit structures on the substrate. For conformal layers, in particular, chemical mechanical polishing is useful in producing planar upper surfaces since higher regions of the layer (e.g., those overlying the interlevel dielectric) are removed before lower regions (e.g., those within contact or via openings and the like), and since other materials such as the interlevel dielectric are also removed. Planar upper surfaces facilitate photo-lithography and other processes required for formation of additional layers and/or structures over the polished layer.

Chemical mechanical polishing of tungsten, however, is highly chemical in nature. Tungsten removal by known chemical mechanical polishing processes is quite uniform across the surface of the layer, and is nearly independent of topography. This results in excessive removal of tungsten and "dishing" of the remaining tungsten regions. For example, FIG. 3A illustrates a tungsten metal layer 300 formed conformally over an interlevel dielectric 301, where the dielectric layer 301 is patterned to produce three different types of conductive structures after chemical mechanical polishing: tungsten contacts or vias within openings 302; tungsten interconnects formed by the damascene method within grooves 303 (shown in cross-section and having an extended length not visible in the view illustrated); and tungsten capacitive electrodes for metal oxide semiconductor (MOS) capacitors within trough 304 (also shown in cross-section and having an extended length, which is not visible, for a total area proportional to the desired capacitance).

FIG. 3B illustrates the integrated circuit structure of FIG. 3A at an intermediate point during a chemical mechanical polishing process employed to pattern the tungsten metal layer by removal of the portions overlying interlevel dielectric 301. After partial removal of the tungsten layer by chemical mechanical polishing, tungsten layer 305 remains but, because removal of the tungsten layer by chemical mechanical polishing is largely uniform, is already beginning to dish in lower regions 306 and 307 and is not planarized. Dishing may be particularly pronounced in lower regions 307 having a large area, such as the region 304 for forming MOS capacitor electrode, and less extreme in lower regions having a smaller area (e.g., regions 302 for contacts or vias).

FIG. 3C illustrates the integrated circuit structure of FIG. 3A after completion of a chemical mechanical polishing process employed to pattern the tungsten metal layer, after complete removal of the portions overlying interlevel dielectric 301. The remaining tungsten regions 308 exhibit substantial dishing, and the tungsten layer may be completely removed in some regions 309.

Dishing of tungsten metal layers patterned by chemical mechanical polishing may cause several problems. Dishing of tungsten plugs within contact or via openings exposes the tungsten plug to slurry contamination, which leads to severe interconnect failures. Dishing of interconnects may causes shorts or thin, high resistance points within the conductive path. Dishing of capacitor electrodes, particularly if the tungsten is completely removed at points, may result in a different capacitance than intended.

There is, therefore, a need in the art for a process of mitigating dishing during chemical mechanical polishing of conformal tungsten layers.

SUMMARY OF THE INVENTION

To address the above-discussed deficiencies of the prior art, it is a primary object of the present invention to provide, for use in forming conductive structures within an integrated circuit, a protective barrier layer, formed of a material such as titanium or titanium nitride for which removal by chemical mechanical polishing (CMP) is primarily mechanical rather than primarily chemical, on a conformal tungsten layer. During subsequent CMP to pattern the tungsten layer, upper topological regions of the protective barrier layer (such as those overlying interlevel dielectric regions) are removed first, exposing the tungsten under those regions to removal, while protective barrier layer regions over lower topological regions (such as openings within the interlevel dielectric) remain to prevent chemical attack of underlying tungsten. CMP patterned tungsten is thus substantially planar with the interlevel dielectric without dishing, even in large area tungsten structures such as MOS capacitor structures.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIGS. 1A-1C depict cross-sections of an integrated circuit structure during various stages of a process for selectively forming tungsten metal regions by chemical mechanical polishing according to one embodiment of the present invention;

FIGS. 2A-2B depict cross-sections of an integrated circuit structure during various stages of a process for selectively forming tungsten metal regions by chemical mechanical polishing according to another embodiment of the present invention.

DETAILED DESCRIPTION OF THE INVENTION

Figure 3A:
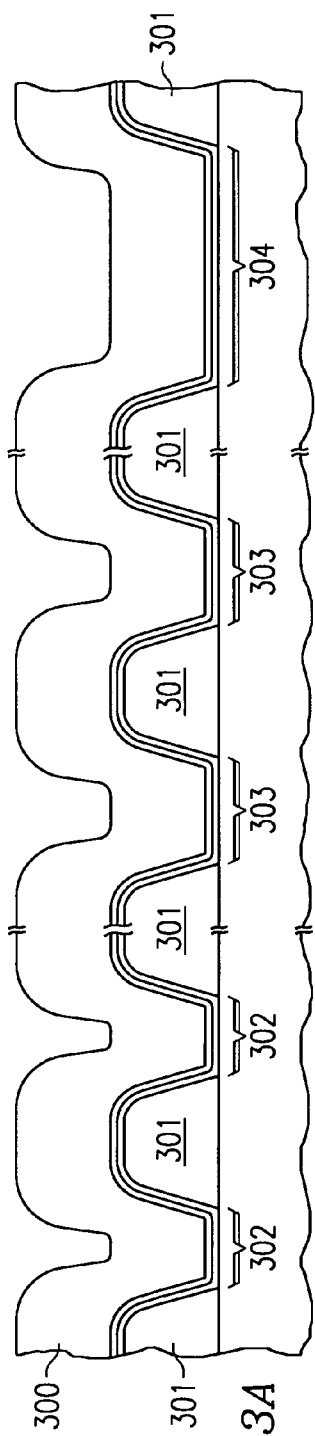
FIGS. 3A-3C depict cross-sections of an integrated circuit structure during various stages of a known process for selectively forming tungsten metal regions by chemical mechanical polishing.
Figure 3B:
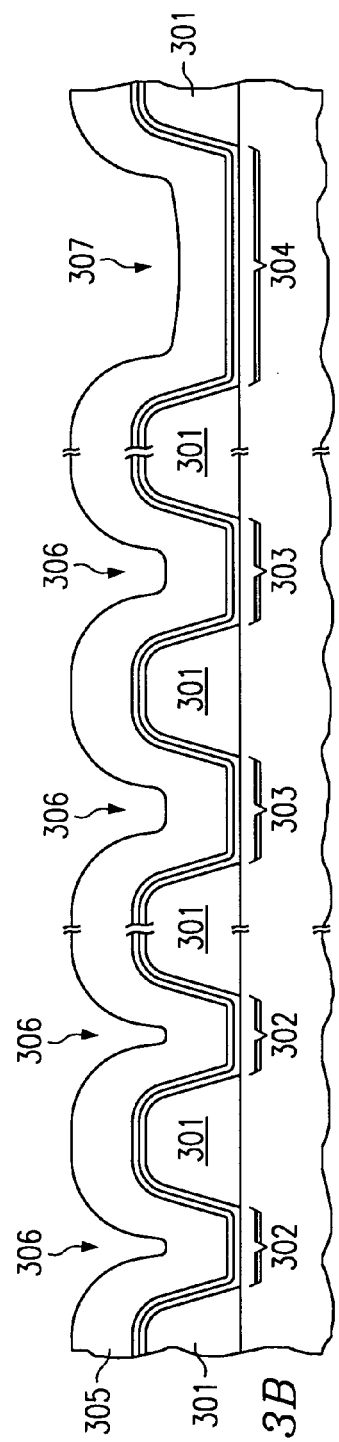
Figure 3C:
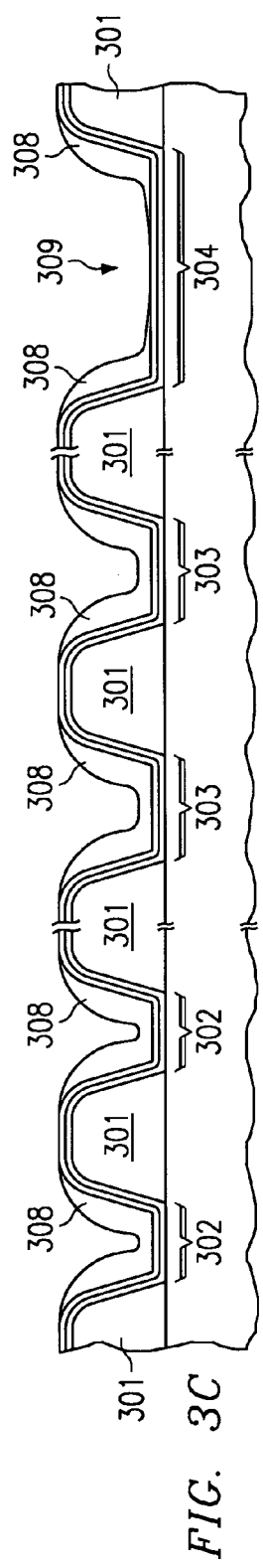

Only those portions of the structures and/or processes employed to fabricate a complete integrated circuit which are unique to the present invention, or which are required for an understanding of the present invention, are described below and/or depicted in the referenced figures. Nonetheless, the present invention may be practiced in conjunction with such other structures and processes to form a completed integrated circuit.

FIGS. 1A through 2B, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIGS. 1A-1C depict cross-sections of an integrated circuit structure during various stages of a process for selectively forming tungsten metal regions by chemical mechanical polishing according to one embodiment of the present invention. Interlevel dielectric layer 100 is formed over a substrate 101, and over any layers formed on the substrate such as lower metallization levels, and selectively patterned to include openings therethrough for formation of various conductive structures.

By way of example, contact or via openings 102 are formed through the dielectric layer 100 over underlying conductive regions (not shown) such as a source/drain region within the substrate, a gate electrode, or an interconnect, contact or landing pad within a lower metallization level. Grooves 103 are formed for lateral interconnects (signal lines) extending over an insulating region for a length (not shown) within the dielectric layer 100. Trough 104 is formed over an insulating layer and a conductive region within the substrate (not shown) to define a region for a capacitive electrode within an MOS capacitor. Openings for formation of other conductive structures may also be formed within dielectric layer 100.

In the exemplary embodiment, a multilayer conformal barrier and/or adhesion layer including a titanium (Ti) layer 105 and a titanium nitride (TiN) layer 106 is formed over the dielectric layer 100 and within the openings 102-104. Other barrier/adhesion structures such as a TiN—Ti—TiN layer may alternatively be employed. A conformal tungsten bulk metal layer 107 is formed on the barrier layers 105 and 106 to a thickness of 4500-8000 angstroms.

In the present invention, a protective or barrier layer 108 is formed on the tungsten layer 107. Protective barrier layer 108 is formed of a material for which chemical mechanical polishing is primarily mechanical rather than primarily chemical, as is the case with tungsten. Instead of being uniformly removed by chemical mechanical polishing, higher topological portions (thus furthest from the substrate body 101) of the layer 108 are removed before lower topological regions, and layer 108 thus exhibits a planarization efficiency which is much larger than that of tungsten. Suitable materials for protective barrier layer 108 include titanium and titanium nitride, for which removal by chemical mechanical polishing depends largely on mechanical energy.

Protective barrier layer 108 may be formed to a thickness of between about 100 and 800 angstroms, depending upon the chemical mechanical polishing process employed and the size of the conductive structures being patterned. Dishing becomes more prevalent as the dimensions of the tungsten structure increase, and certain large area conductive structures (such as capacitor electrodes) are therefore most susceptible.

FIG. 1B illustrates the integrated circuit structure of FIG. 1A at an intermediate point during a chemical mechanical polishing process employed to pattern the tungsten metal layer by removal of the portions overlying interlevel dielectric 100. As noted above, higher topological portions of the protective barrier layer 108 are removed first by chemical mechanical polishing, leaving the protective barrier layer regions 109 over the lower topological regions (i.e., those corresponding to openings 102-104 within dielectric layer 100) to protect the underlying tungsten in those regions from chemical attack. Exposed portions 110 of the tungsten layer 107 where the protective barrier layer 108 is removed are oxidized and abraded for removal. However, the remaining portions 109 of the protective barrier layer do not allow oxidation of the tungsten covered by those regions 109.

FIG. 1C illustrates the integrated circuit structure of FIG. 1A after completion of a chemical mechanical polishing process employed to pattern the tungsten metal layer 107, after complete removal of the portions of tungsten layer 107 overlying interlevel dielectric 100. In this embodiment, the protective barrier layer is completely removed by chemical mechanical polishing, together with portions of the tungsten and barrier layers overlying the dielectric layer 100. The remaining portions of the tungsten layer 111 within openings 102-104, not removed by the chemical mechanical polishing, are substantially planar with the dielectric layer 102.

FIGS. 2A-2B depict cross-sections of an integrated circuit structure during various stages of a process for selectively forming tungsten metal regions by chemical mechanical polishing according to another embodiment of the present invention. The basic structure and process is identical to that depicted in FIGS. 1A through 1C and described above. In this embodiment, however, the tungsten layer 200 is formed with a thickness which is insufficient to fill the openings 102-104 (i.e., less than the thickness of dielectric layer 100), although the overlying protective barrier layer 108 fills any remainder of openings 102-104 not filled by tungsten layer 200.

FIG. 2B illustrates the integrated circuit structure of FIG. 2A after completion of a chemical mechanical polishing process employed to pattern the tungsten metal layer 200, after complete removal of the portions of tungsten layer 200 overlying interlevel dielectric 100. At a result of the reduced thickness of the tungsten layer 200, after completion of the chemical mechanical polishing process and removal of the portions of the protective barrier layer 108, tungsten layer 200, and barriers layer 105 and 106 which overlying the dielectric layer 100, portions 202 of the protective barrier layer remain, together with portions 201 of the tungsten layer, within the openings 102-104. If titanium or titanium nitride is employed as the protective barrier layer, however, these remaining portions 202 may simply contribute to the barrier layer for the next metallization level.

The present invention allows tungsten to be reliably patterned by chemical mechanical polishing by reducing dishing, particularly for tungsten regions having a large area. Improved process margins and yield are thereby provided by the present invention.

Although the present invention has been described in detail, those skilled in the art will understand that various changes, substitutions and alterations herein may be made without departing from the spirit and scope of the invention it its broadest form.

The invention claimed is:

1. A method of forming a conductive structure within an integrated circuit comprising:
   forming a conformal tungsten layer over a dielectric layer and within and filling any unfilled portions of openings within the dielectric layer;
   forming an etch protective barrier layer over the tungsten layer, wherein the etch protective barrier layer comprises a material for which removal by chemical mechanical polishing is primarily mechanical; and
   removing by chemical mechanical polishing the etch protective barrier layer overlying the tungsten layer over the dielectric layer and a portion of the tungsten layer within the openings.

2. The method as set forth in claim 1 wherein the step of forming an etch protective barrier layer over the tungsten layer further comprises:
   forming a titanium or titanium nitride layer on the tungsten layer.

3. The method as set forth in claim 2 wherein the step of removing by chemical mechanical polishing the etch protective barrier layer overlying the tungsten layer over the dielectric layer and a portion of the tungsten layer within the openings further comprises:
   removing portions of the tungsten layer overlying the dielectric layer without removing portions of the tungsten layer within the openings within the dielectric layer.

4. The method as set forth in claim 3 wherein the step of removing by chemical mechanical polishing the etch protective barrier layer overlying the tungsten layer over the dielectric layer and a portion of the tungsten layer within the openings further comprises:
   after removing the protective barrier layer overlying the dielectric regions between the openings within the dielectric layer, removing portions of the tungsten layer overlying the dielectric regions between the openings within the dielectric layer; and
   during removal of portions of the tungsten layer overlying the dielectric regions between the openings within the dielectric layer, removing portions of the protective barrier layer overlying the openings within the dielectric layer.

5. The method as set forth in claim 2 wherein the step of removing by chemical mechanical polishing the etch protective barrier layer overlying the tungsten layer over the dielectric layer and a portion of the tungsten layer within the openings further comprises:
   removing portions of the etch protective barrier layer and the tungsten layer overlying dielectric regions between the openings within the dielectric layer to planarize remaining portions of the tungsten layer and remaining portions of the protective barrier layer, if any, with the dielectric layer.

6. The method as set forth in claim 2, wherein at least one opening within the dielectric layer is sized to form a capacitive electrode from tungsten within the at least one opening.

7. The method as set forth in claim 1, wherein the step of removing by chemical mechanical polishing the etch protective barrier layer overlying the tungsten layer over the dielectric layer and portions of the tungsten layer within the openings exposes an upper surface of the tungsten layer around the portion of the etch protective barrier layer.

8. The method as set forth in claim 1, wherein the etch protective barrier layer overlies the entire tungsten layer.

9. The method as set forth in claim 1, wherein the conformal tungsten layer has a thickness of between about 4500 and 8000 angstroms.

10. The method as set forth in claim 1, wherein the etch protective barrier layer has a thickness between about 100 and 800 angstroms.

11. A method of forming a portion of an integrated circuit structure, the method comprising:
    forming a tungsten layer over a dielectric layer having an opening therein, wherein the tungsten layer fills a majority of a depth of the opening across a width of the opening and wherein an upper surface of the conformal tungsten within a central region of the opening is below an upper surface of the dielectric layer;
    forming an etch protective barrier layer over the tungsten layer, wherein the etch protective barrier layer comprises a material for which removal by chemical mechanical polishing is primarily mechanical; and
    removing at least portions of the etch protective barrier layer and the tungsten layer by chemical mechanical polishing, wherein a portion of the etch protective barrier layer remains over only a central region of the tungsten, but not over either peripheral regions of the tungsten within the opening or portions of the tungsten layer over the dielectric layer.

12. The method as set forth in claim 11, wherein the step of forming an etch protective barrier layer over the tungsten layer further comprises:
    forming a titanium or titanium nitride layer on the tungsten layer.

13. The method as set forth in claim 12, wherein the step of removing at least portions of the etch protective barrier layer and the tungsten layer by chemical mechanical polishing further comprises:
    removing portions of the tungsten layer overlying the dielectric layer without removing portions of the tungsten layer within the opening.

14. The method as set forth in claim 12, wherein the step of removing at least portions of the etch protective barrier layer and the tungsten layer by chemical mechanical polishing further comprises:
    after removing the protective barrier layer overlying the dielectric layer, removing portions of the tungsten layer overlying the dielectric layer; and
    during removal of portions of the tungsten layer overlying the dielectric layer, removing portions of the protective barrier layer overlying the opening.

15. The method as set forth in claim 12, wherein the step of removing at least portions of the etch protective barrier layer and the tungsten layer by chemical mechanical polishing further comprises:
   removing portions of the etch protective barrier layer and the tungsten layer overlying the dielectric layer to planarize remaining portions of the tungsten layer and remaining portions of the protective barrier layer, if any, with the dielectric layer.

16. The method as set forth in claim 11, wherein the opening within the dielectric layer is sized to form a capacitive electrode from tungsten within the opening.

17. The method as set forth in claim 11, wherein the step of removing at least portions of the etch protective barrier layer and the tungsten layer by chemical mechanical polishing exposes an upper surface of the tungsten layer around the portion of the etch protective barrier layer.

18. The method as set forth in claim 11, wherein the etch protective barrier layer overlies the entire tungsten layer.

19. The method as set forth in claim 11, wherein the conformal tungsten layer has a thickness of between about 4500 and 8000 angstroms.

20. The method as set forth in claim 11, wherein the etch protective barrier layer has a thickness between about 100 and 800 angstroms.

* * * * *

UNITED STATES PATENT AND TRADEMARK OFFICE
CERTIFICATE OF CORRECTION

PATENT NO. : 7,534,719 B2  
APPLICATION NO. : 12/082188  
DATED : May 12, 2009  
INVENTOR(S) : Charles R. Spinner, III, Rebecca A. Nickell and Todd H. Gandy Page 1 of 1

It is certified that error appears in the above-identified patent and that said Letters Patent is hereby corrected as shown below:

Column 6, Claim 11, line 29, before "tungsten", insert -- conformal --;  
Column 6, Claim 11, line 30, before "tungsten", insert -- conformal --;  
Column 6, Claim 11, line 33, after "tungsten", insert -- layer --;  
Column 6, Claim 11, line 35, before "tungsten", insert -- conformal --;  
Column 6, Claim 11, line 40, before "tungsten", insert -- conformal --;  
Column 6, Claim 11, line 44, before "tungsten", insert -- conformal --;  
Column 6, Claim 12, line 47, before "tungsten", insert -- conformal --;  
Column 6, Claim 12, line 49, before "tungsten", insert -- conformal --;  
Column 6, Claim 13, line 53, before "tungsten", insert -- conformal --;  
Column 6, Claim 13, line 55, before "tungsten", insert -- conformal --;  
Column 6, Claim 13, line 56, before "tungsten", insert -- conformal --;  
Column 6, Claim 14, line 60, before "tungsten", insert -- conformal --;  
Column 6, Claim 14, line 63, before "tungsten", insert -- conformal --;  
Column 6, Claim 14, line 65, before "tungsten", insert -- conformal --;  
Column 7, Claim 15, line 3, before "tungsten", insert -- conformal --;  
Column 7, Claim 15, line 6, before "tungsten", insert -- conformal --;  
Column 7, Claim 15, line 7, before "tungsten", insert -- conformal --;  
Column 8, Claim 17, line 1, before "tungsten", insert -- conformal --;  
Column 8, Claim 17, line 2, before "tungsten", insert -- conformal --; and  
Column 8, Claim 18, line 5, before "tungsten", insert -- conformal --.

Signed and Sealed this  
Third Day of July, 2012

David J. Kappos  
*Director of the United States Patent and Trademark Office*